(12) United States Patent
Kuroda (10) Patent No.: US 6,241,143 B1
(45) Date of Patent: Jun. 5, 2001

(54) PRODUCING METHOD OF A FILM-TYPE TRANSMISSION LINE AND METHOD OF CONNECTING TO AN EXISTING LINE

(75) Inventor: Kazushi Kuroda, Toyota (JP)

(73) Assignee: Toyota Jidosha Kabushiki Kaisha, Aichi-ken (JP)

(*) Notice: Subject to any disclaimer, the term of this patent is extended or adjusted under 35 U.S.C. 154(b) by 0 days.

(21) Appl. No.: 09/393,187

(22) Filed: Sep. 10, 1999

(30) Foreign Application Priority Data

Sep. 11, 1998 (JP) .................................................. 10-258420

(51) Int. Cl.[7] .............................. B23K 1/06; B23K 31/10
(52) U.S. Cl. ...................................... 228/110.1; 228/179.1
(58) Field of Search .................................. 228/110.1, 144, 228/154, 179.1; 29/428, 432, 432.1, 432.2, 739

(56) References Cited

U.S. PATENT DOCUMENTS

| | | | | |
|---|---|---|---|---|
| 3,640,764 | * | 2/1972 | Shevlin | 117/212 |
| 4,113,578 | * | 9/1978 | Del Monte | 204/15 |
| 4,357,750 | * | 11/1982 | Ostman | 29/847 |
| 4,912,547 | * | 3/1990 | Bilowith et al. | |
| 5,274,195 | * | 12/1993 | Murphy et al. | 174/117 |
| 5,557,695 | * | 9/1996 | Yamane et al. | 385/49 |
| 5,726,480 | * | 3/1998 | Pister | 257/415 |
| 5,904,499 | * | 5/1999 | Pace | 438/108 |
| 5,915,752 | * | 6/1999 | DiStefano et al. | 29/827 |
| 5,992,326 | * | 11/1999 | Martinez-Tovar et al. | 102/202.4 |

FOREIGN PATENT DOCUMENTS 7-170115    7/1995  (JP) .

* cited by examiner

*Primary Examiner*—Patrick Ryan
*Assistant Examiner*—Jonathan Johnson
(74) *Attorney, Agent, or Firm*—Finnegan, Henderson, Farabow, Garrett & Dunner, L.L.P.

(57) ABSTRACT

An exposed connecting portion is formed by partially removing a film substrate by such laser etching while leaving a transmission line pattern. A film-type transmission line is placed in such a manner as to overlap the exposed connecting portion and a transmission line pattern on a side to be connected. Bonding, for example thermo compression bonding, is applied to the two overlapped line patterns. Since a gold ribbon is not used and overlapping of a high-dielectric substrate and the film substrate is unnecessary, impedance irregularity is reduced. This makes it possible to carry out bonding without the medium of the film substrate and a connection with high reliability may be achieved.

12 Claims, 8 Drawing Sheets

Fig. 3A  COPLANAR LINE

Fig. 3B  MICROSTRIP LINE

| JUNCTION TYPE | PREPROCESSING FOR MMIC PAD SIDE | PREPROCESSING FOR SUSPENDED LINE SIDE | JUNCTION | RELIA- BILITY |
|---|---|---|---|---|
| A | Au STUD BUMP | Au OR Sn PLATING | THERMOCOMPRESSION BONDING | ↑ HIGH |
| B | — | Au PLATING | THERMOCOMPRESSION BONDING | |
| C | — | Al EVAPORATION | ULTRASONIC BONDING | LOW |

PRODUCING METHOD OF A FILM-TYPE TRANSMISSION LINE AND METHOD OF CONNECTING TO AN EXISTING LINE

BACKGROUND OF THE INVENTION

1. Field of the invention

The present invention generally relates to a method for producing a film-type transmission line and a method for connecting the line, and more particularly to a reduction of impedance irregularity at a junction of a transmission line.

2. Description of the Related Art

Figure 1:
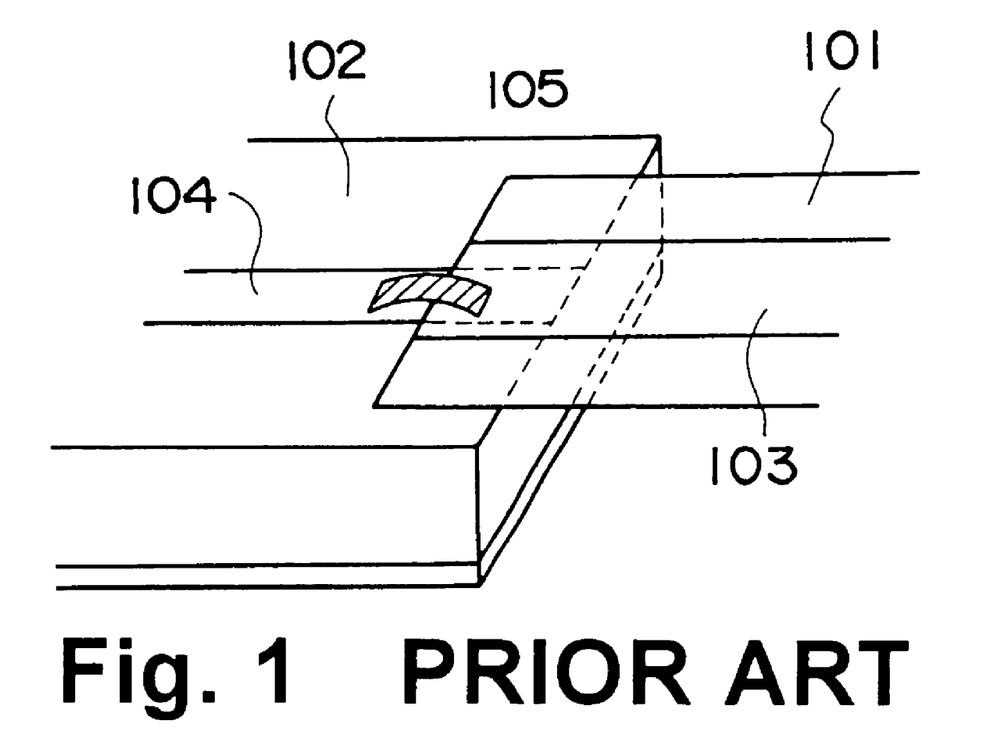
FIG. 1 is a drawing showing a connecting portion of a film-type transmission line using a conventional gold ribbon.

FIG. 1 shows a conventional constitution of a junction between a film substrate and a high-dielectric substrate in a high-frequency circuit of such a radar system. Prior art generally attempts to perform ribbon bonding using a gold ribbon. A film substrate 101 and a substrate of high permittivity 102 (e.g. ceramic) are constituted of transmission line patterns 103 and 104 respectively. The film substrate 101 is placed over the substrate of high permittivity 102 and a gold ribbon 105 lying astride both of the substrates is crimped through thermocompression bonding.

A method of connection of this type is shown in Japanese Patent Laid-Open Publication No. Hei 7- 170115. In FIG. 1 of the patent document, the antenna pattern 11(A) on a film substrate 11 is connected to a circuit pattern 14 through a gold ribbon 17.

The connection through a ribbon in the prior art has disadvantages that a characteristic-impedance irregularity occurs at each junction, reflection of a signal is relatively high, and transmission loss is significant. In addition, the film substrate 101 and the substrate of high permittivity 102 are required to overlap one another as shown in FIG. 1, which causes a disadvantage of developing an impedance irregularity on an overlapped area.

Turning the film substrate 101 upside down allows patterns of both of the substrates to be connected by positioning them opposite to each other, in a face connection. As a result of this, the impedance irregularity may be reduced. However it is required to perform a bonding process through the medium of the film substrate 101 or the substrate of high permittivity 102 so that a disadvantage of lowered connecting force arises.

SUMMARY OF THE INVENTION

It is an object of the present invention to provide a method for producing a film-type transmission line and a method of connection being capable of easily constituting a connection with reduced impedance irregularity.

In order to achieve this object, according to the method for producing a film-type transmission line of the present invention, a transmission line pattern is first constituted on a film substrate. The film substrate is then partially removed with the remaining substrate constituting the transmission line pattern. As a result, a part where the transmission line pattern is exposed from the film substrate is formed as an exposed connecting portion to connect another transmission line.

The transmission line pattern produced through the aforementioned method is connected to a transmission line on a side to be connected by the following method. The film-type transmission line is placed in such a manner that the exposed connecting portion overlaps the transmission line pattern on a side to be connected. Bonding for the overlapped portion is then processed from a side of the exposed connecting portion.

As the exposed connecting portion is thus provided according to the present invention, connection between mutual pattern faces may be constituted by overlapping the exposed connecting portion and the transmission line pattern on a side to be connected. A ribbon is not used and there is no necessity to overlap the film substrate on the substrate to be connected. This allows any impedance irregularity to be reduced. In addition, a high reliability connection is capable of being constituted easily because bonding processing is not applied on the medium of the film substrate but directly on the exposed connecting portion, where is an extended portion of the line pattern.

A method of connection of this invention preferably comprises steps of making gold or aluminum adhere on the exposed connecting portion of the film-type transmission line, overlapping the exposed connecting portion to which by gold or aluminum is adhered and the transmission line pattern of gold or aluminum formed on the high-dielectric substrate on the side to be connected, and performing thermocompression bonding or ultrasonic bonding. The adhesion processing at this point is, for example, plating, evaporation, or transcription bump processing, which will be described later. Generally, material used for the line pattern of the film-type transmission line is copper and material used for the line pattern of the high-dielectric substrate of ceramics, for example, is gold or aluminum. According to this invention, these patterns made by different kinds of material may be easily connected together.

DESCRIPTION OF PREFERRED EMBODIMENT

The following describes a preferred embodiment of the present invention with reference to the drawings.

<METHOD OF PRODUCING A FILM-TYPE TRANSMISSION LINE>

Figure 2A:
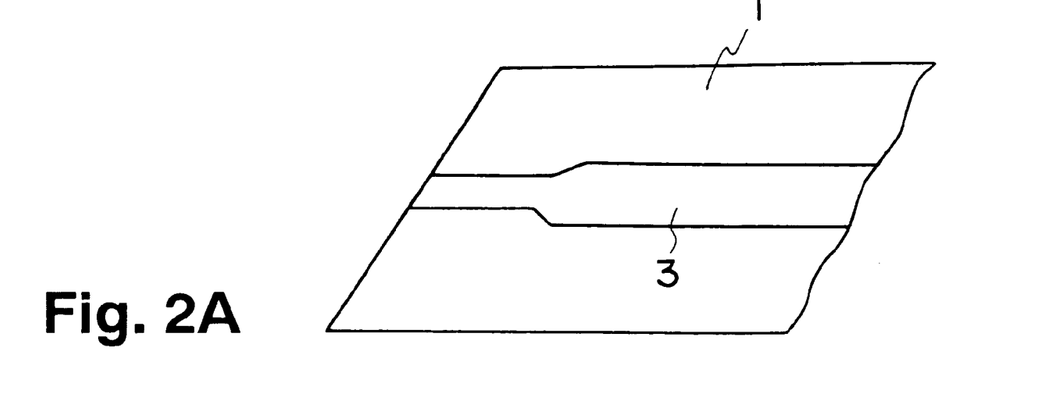
FIGS. 2A, 2B and 2C are drawings showing a method for producing a film-type transmission line of an embodiment of the present invention.

A method for producing a film-type transmission line is described with reference to FIG. 2. First, a transmission line pattern 3 is formed on a single side of a film substrate 1 through a conventional method known well (FIG. 2a). The film-type transmission line is, for example, a strip (triplate) line or a suspended line. Material of the film substrate 1 is such as polyimide or polyester and material of the transmission pattern 3 is copper.

Figure 2B:
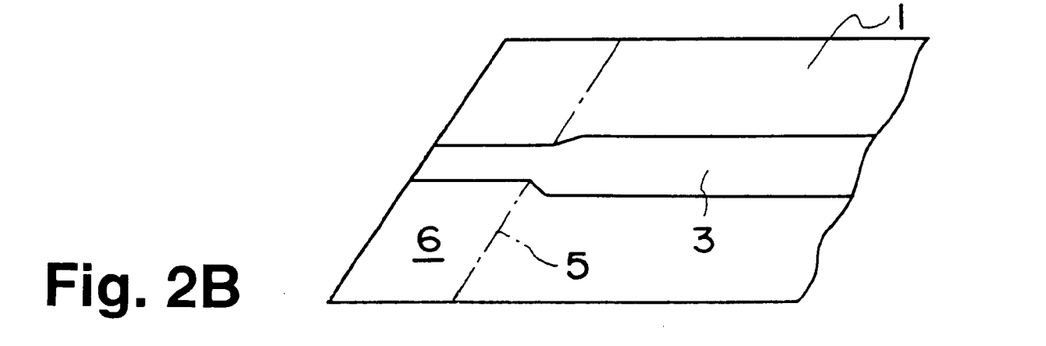
Figure 2C:
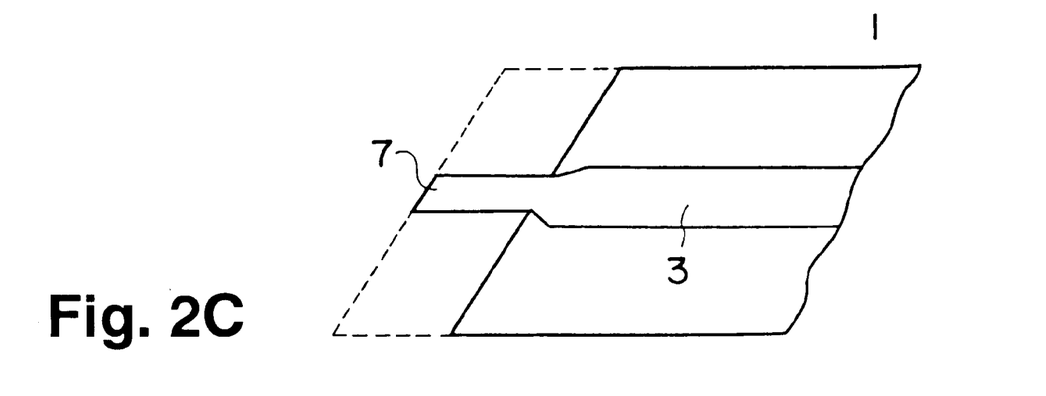

Next, the film substrate 1 is etched along an etching line 5 of FIG. 2b using a laser, such as an impact laser or excimer laser. A border area 6 of the film substrate 1 is removed to leave the transmission line pattern 3. As a consequence of this, an exposed connecting portion 7 is formed as shown in FIG. 2c. The exposed connecting portion 7 is an extended part of the line pattern 3 and protrudes from the film substrate 1. Therefore the face on a substrate side of the pattern is exposed by removal of the film substrate 1. The exposed connecting portion 7 is used for a connection to another transmission line described later.

Producing the film-type transmission line through such a method as described above in this embodiment, a connection between transmission lines with a reduced impedance irregularity becomes possible as follows.

<CONNECTING METHOD OF THE FILM-TYPE TRANSMISSION LINE>

Figure 3A:
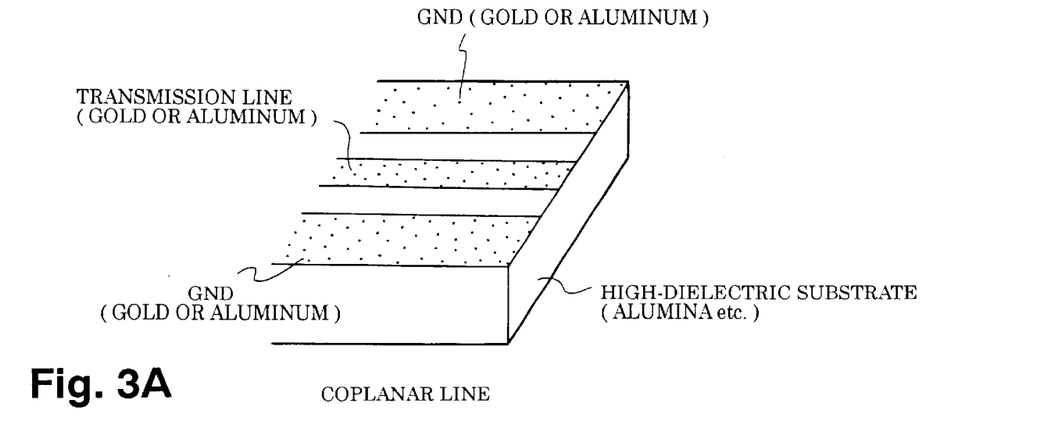
FIGS. 3A and 3B show examples of a transmission line on a side to be connected with the film-type transmission line.
Figure 3B:
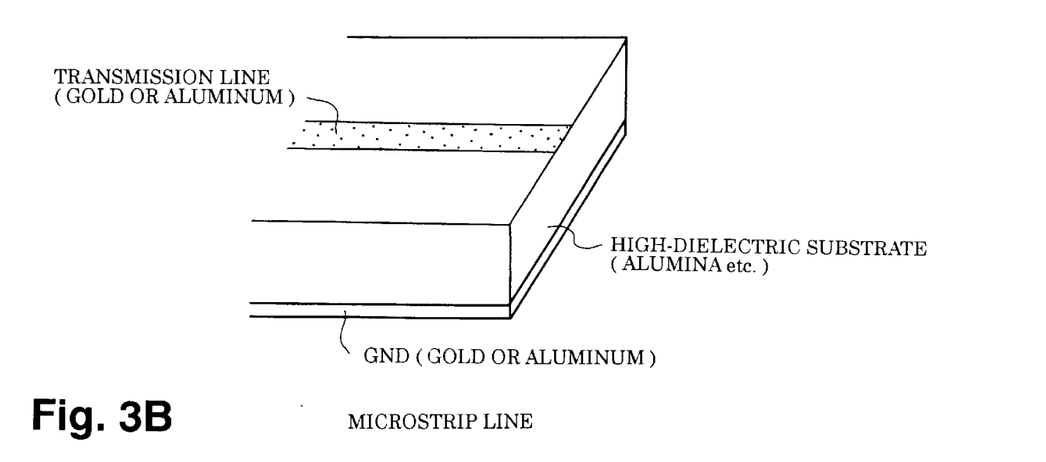

A method for connecting the film-type transmission line to the transmission line on the side to be connected is described below. The transmission line on the side to be connected in this embodiment, is a transmission line of the high-dielectric substrate type, such as a coplanar line or a microstrip line indicated in FIG. 3a and FIG. 3b. The type of the film-type transmission line may be arbitrarily combined with any type of transmission line on the side to be connected. This embodiment is depicted taking a combination of the coplanar line (on the side to be connected) and the microstrip line (on the film side) as an example.

Figure 4:
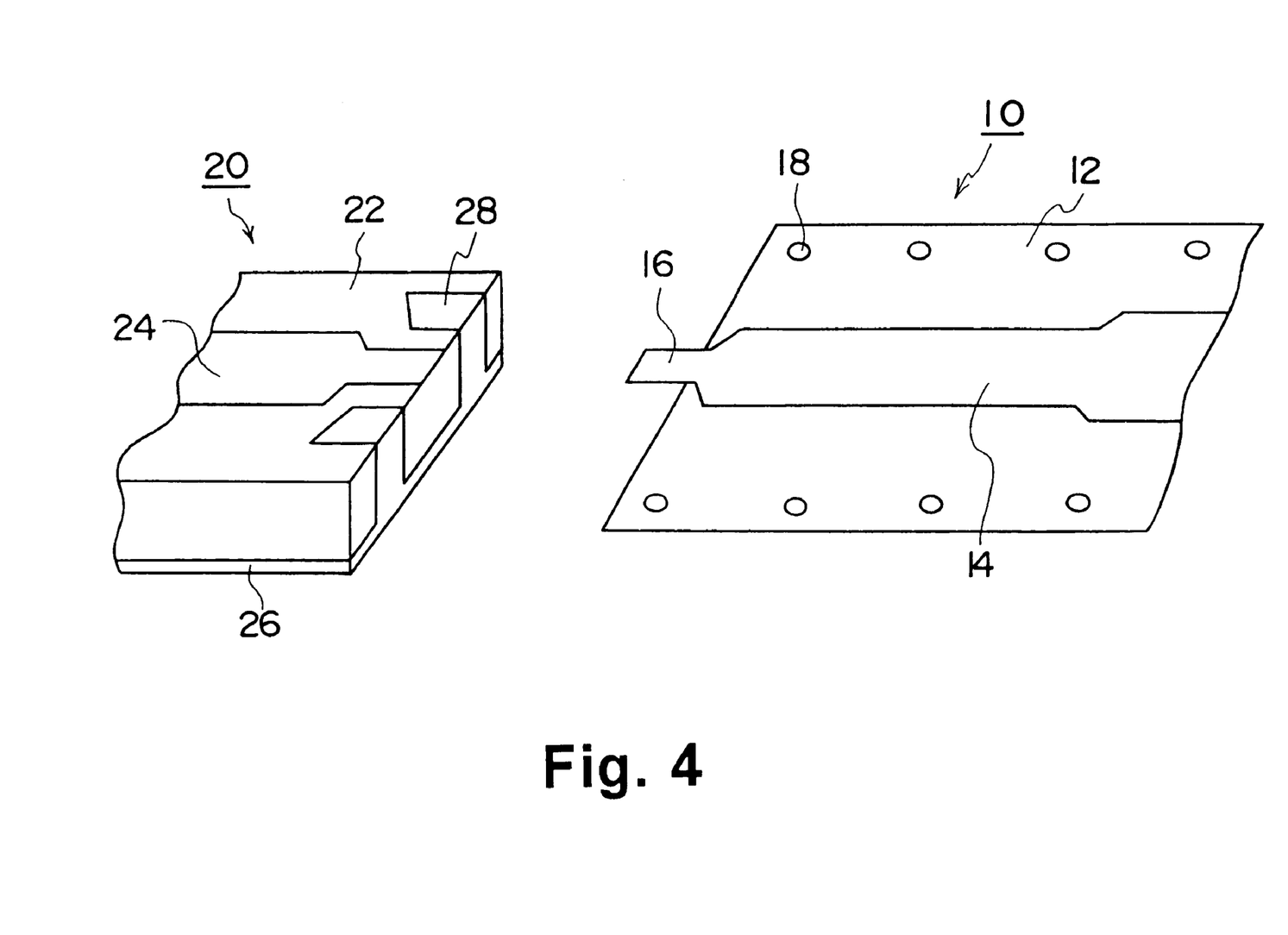
FIG. 4 shows a suspended line as the film-type transmission line and an MMIC as the transmission line on the side to be connected.

Referring to FIG. 4, a film-type transmission line 10 is a suspended line produced using the aforementioned method and comprises a transmission line and ground points (not illustrated) placed leaving a gap on both upper and lower sides of the transmission line. A transmission line pattern 14 is formed on a film substrate 12 made by polyimide of 13 μm thick and constituted by copper having a film thickness of approximately 18 μm. A part of the pattern that is exposed (protruded) from the film substrate 12 as a result of the etching processing forms an exposed connecting portion 16. Ground members (not illustrated) are placed on both upper and lower sides of the film substrate 12 and made from an electrically conductive material such as aluminum. The film substrate 12 is then located between the ground members. The film substrate and the pattern line keep the established gaps between the grounds and themselves. For the purpose of maintaining the gaps, the film substrate 12 has resin dots 18 (thickness: about 100 μm) as spacers in a plurality of places on either side.

An MMIC (Microwave Monolithic Integrated Circuit) 20 is basically a microstrip line but it may also be a coplanar line on an area in the vicinity of a junction to the film side. The top face of a high-dielectric substrate 22 made from alumina is constituted by a transmission pattern 24 (made from gold) and the lower face thereof is covered with a gold ground film 26. The film thickness of the line pattern 24 and the ground 26 is roughly 1.5 μm. Both the line pattern 24 and the ground 26 may be made from aluminum. However, it is required that a suitable material is used for them because of their relation to an IC (not illustrated) located within the high-dielectric substrate 22. Therefore, material of copper for example, can not be used. A part of the ground 26 extends upward along a side of an edge of the substrate 22 and turned around the edge toward the top face of the substrate. This forms a ground 28 on the top face in a border area of the substrate where the coplanar line is constituted as a result.

Figure 5:
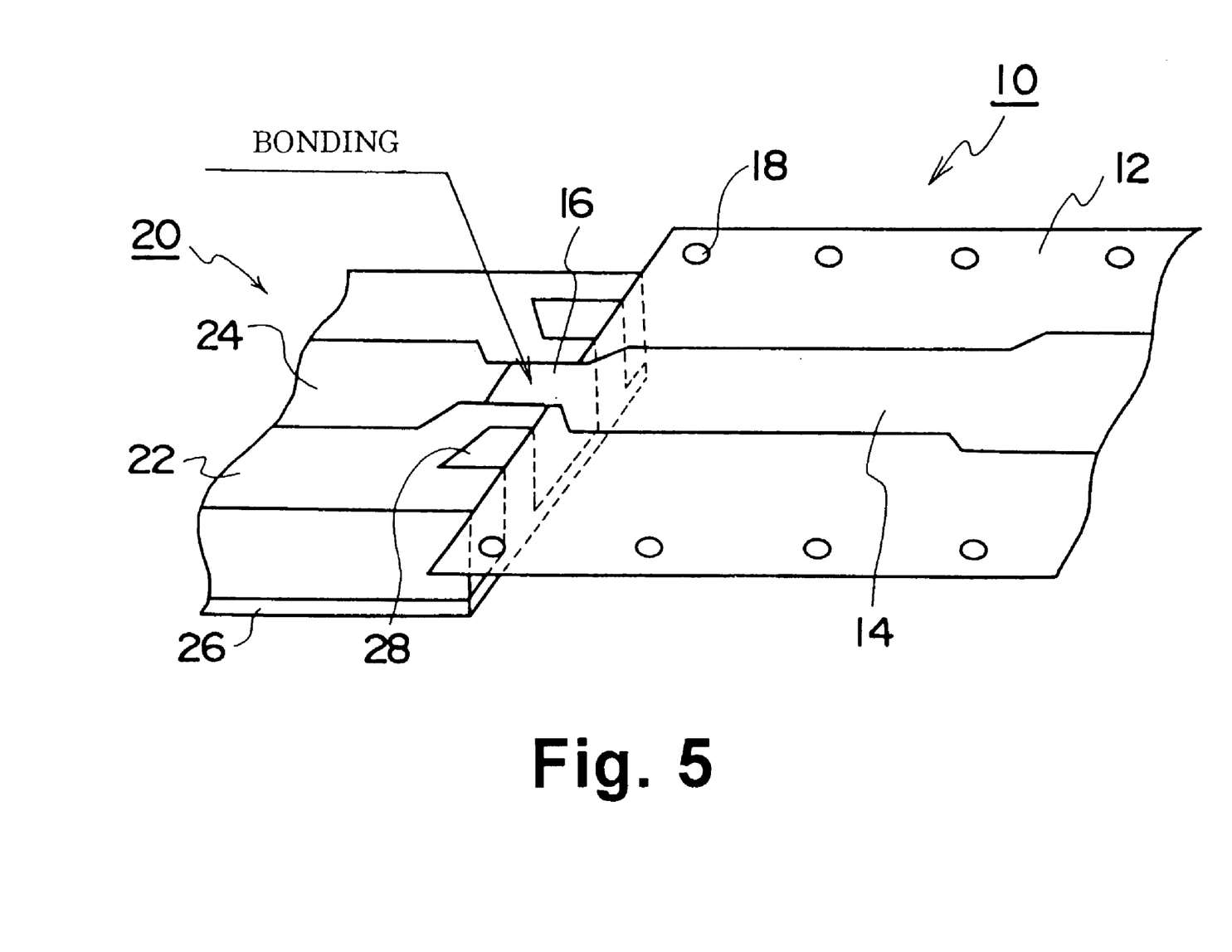
FIG. 5 is a drawing illustrating the placement to connect both of the lines of FIG. 4.

As shown in FIG. 5, the film-type transmission line 10 is placed so as to overlap the exposed connecting portion 16 thereof and the transmission line pattern 24 on the side to be connected is placed taking into consideration the fact that the film substrate 12 is not overlapped with the substrate on the side to be connected, i.e. the high-dielectric substrate 22. Bonding processing from a side of the exposed connecting portion 16 is then applied to both of the overlapped line patterns.

However, the materials of both of the transmission lines are different from each other, as the material of the transmission line on the film side is copper and the material of the transmission line on the high dielectric side is gold or aluminum. Preceding the bonding processing, the exposed connecting portion 16 of the transmission line pattern 14 on the film side is subjected to gold plating in order to ensure the connection between different materials. The gold plating is applied via Ni plating in order to achieve compatibility with the copper material and may be applied to either face of the exposed connecting portion 16 (and may be applied to both of the faces).

Both of the substrates are placed in such a manner that the face of the exposed connecting portion 16 on the side subjected to gold plating confronts the transmission line pattern 24 of the MMIC 20. Thermocompression bonding is applied to a junction where both of the patterns overlap one another. The thermocompression bonding is performed by heating the junction to a predetermined temperature, loading by a tool (not illustrated), and irradiating the junction with ultrasonic waves. Executing irradiation with ultrasonic waves from a side of the exposed connection portion 16 allows direct irradiation without the medium of the film.

Figure 6:
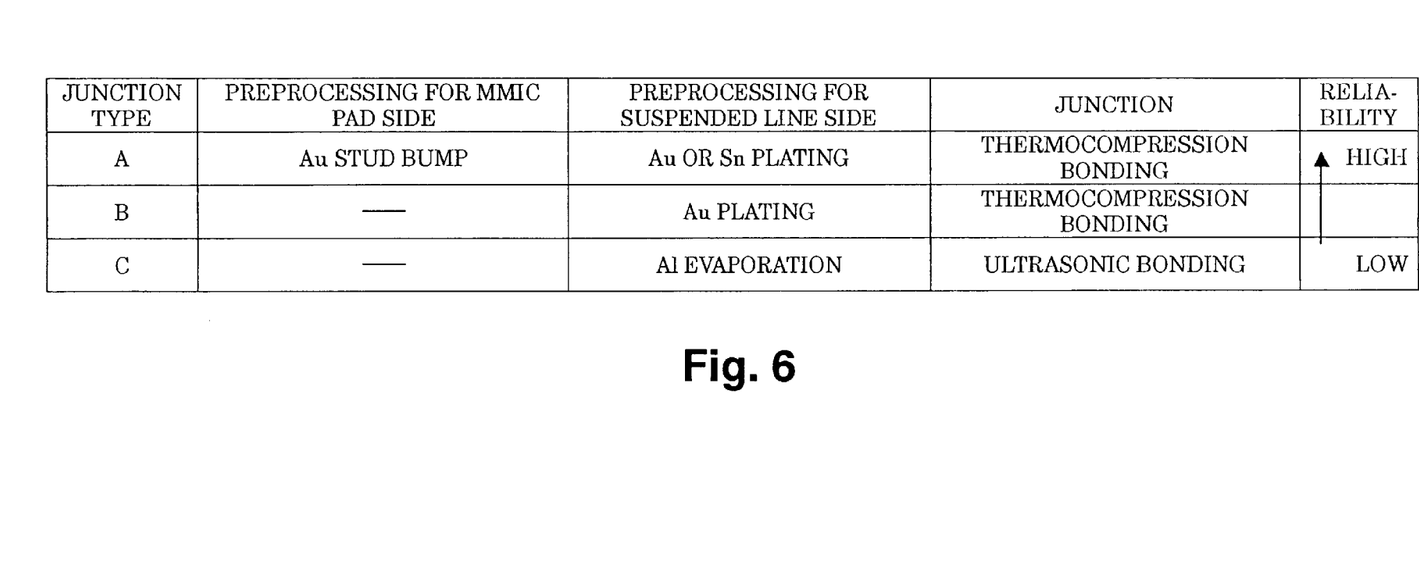
FIG. 6 shows three types of methods for connecting both of the lines of FIG. 4.

In this embodiment other methods for bonding may be preferably applied as described in FIG. 6. The junction type B in FIG. 6 corresponds to the method for bonding described above. In the junction type A, Au (gold) stud bump processing is applied to the junction of the transmission line 24 on the MMIC side and Au plating or Sn plating is applied to the suspended line side as preprocessing for bonding.

Figure 7:
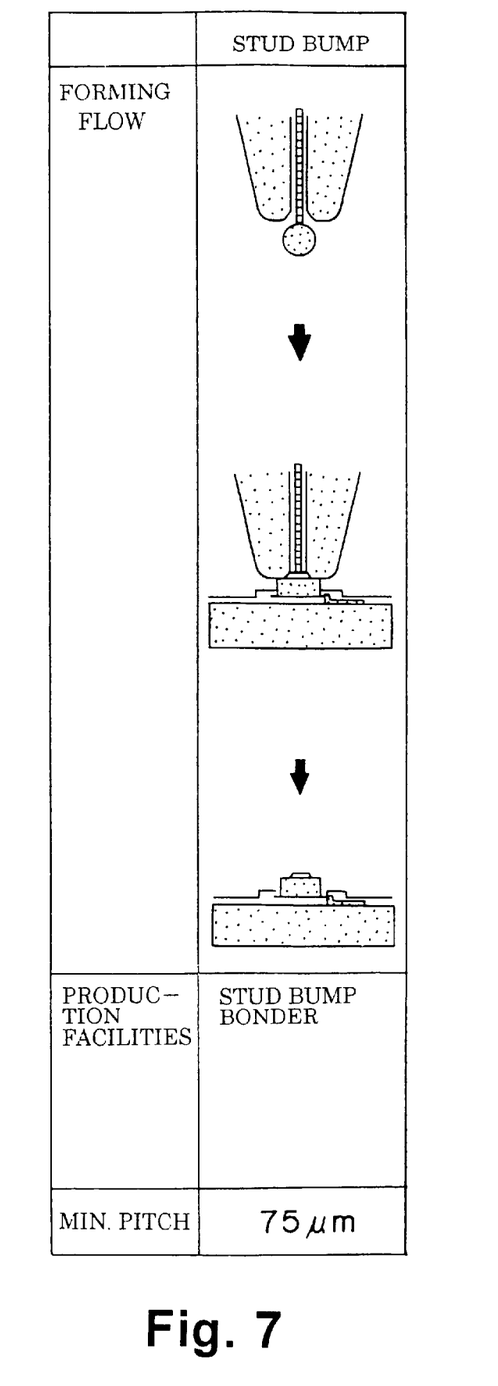
FIG. 7 shows a method for forming an Au stud bump in FIG. 6.

Referring to FIG. 7, a tool called a stud bump bonder is used for the stud bump processing. In the processing, a small amount of gold drained out from a nozzle forms a spherical shape as illustrated in the figure and the gold formed in a spherical shape is pressed against the transmission line pattern 24. The gold material is then transferred to the pattern 24 side and forms a mass in the shape of a button. The mass is a stud bump.

Thermocompression bonding is also performed in the junction type A. The film-type transmission line 10 and the MMIC 20 are placed in such a manner that an Au stud bump on the junction and the exposed connecting portion 16 (plating portion) on the film side face each other being tangential to each other. Heating to the predetermined temperature, imposing of a load and irradiation with ultrasonic waves are performed. The method for bonding stated here is an application of IC packaging technology.

Aluminum evaporation processing is carried out on the exposed connecting portion 16 as preprocessing in the junction type C of FIG. 6, wherein ultrasonic bondi performed using aluminum as a medium. In the ultrasonic bonding, a heating process is omitted from the aforementioned thermocompression bonding. With the exposed connecting portion 16 and the line pattern 24 on the side to be connected in an overlapping state, a load is imposed and the ultrasonic waves are irradiated.

In each junction type A, B or C, the preprocessing of the suspended line side may be applied to either face of the exposed connecting portion 16 (and may be applied to both of the faces). The bonding is performed in such a positional relationship that the side being preprocessed faces the line pattern on the MMIC side.

In this embodiment, any one of the junction types A, B and C may be applied, but reliability increases in alphabetical order as shown in FIG. 6. Moreover, the material of the line pattern 24 on the MMIC side may be either gold or aluminum in any one of the junction types A, B and C.

Figure 8:
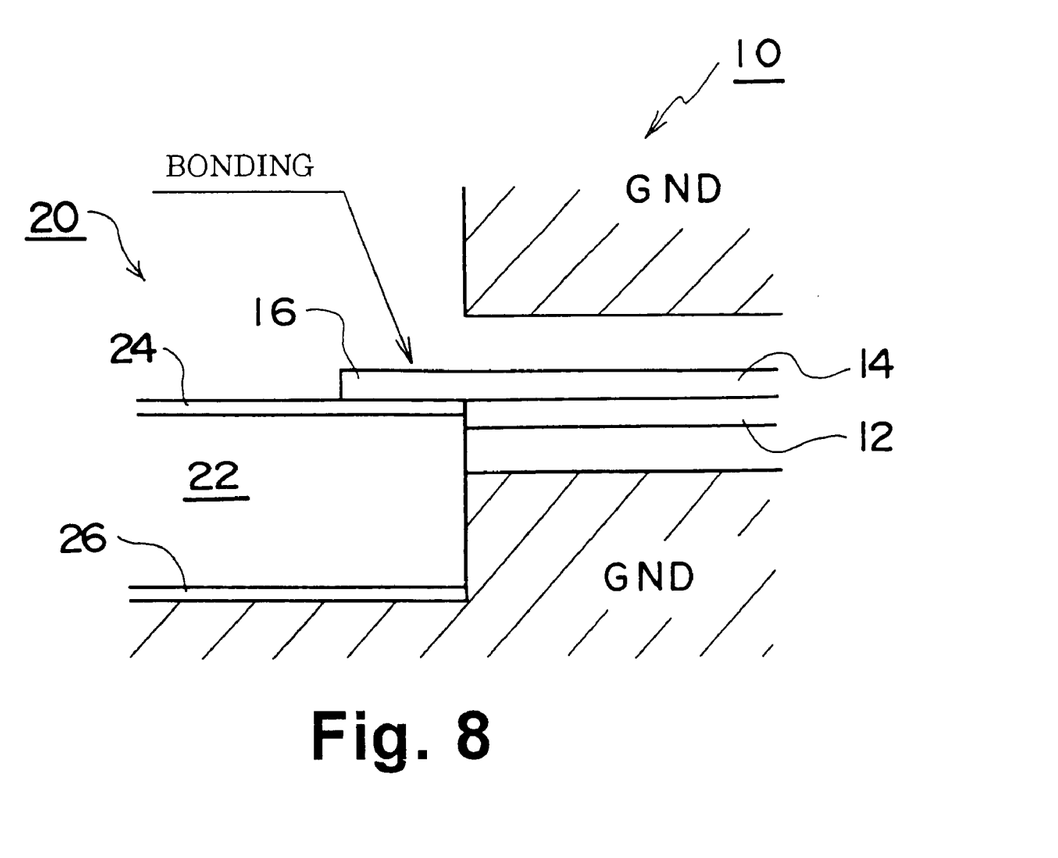
FIG. 8 is a sectional view showing a suspended line and an MMIC connected through a method of connection of an embodiment of the present invention.

FIG. 8 is a sectional view in schematic form depicting the connection between the film-type transmission line 10 and the MMIC 20 in a manner mentioned above. Bonding is applied to an area where the exposed connecting portion 16 overlaps the transmission line on the MMIC side. This is known as face connection, that is to say the connection in a state where the faces of both of the line patterns face each other. Irregularity of characteristic impedance is reduced because a gold ribbon is not used. In addition, the film substrate 12 does not overlap the high-dielectric substrate 22. This also reduces the impedance irregularity. It is therefore possible to accomplish the reduction in transmission loss by reducing the impedance irregularity more effectively than prior art methods and suppressing reflection of signals.

Furthermore, this embodiment allows high reliability to be obtained. With the assumption that the bonding is performed by preparing a pattern face wherein the exposed connecting portion 16 is not formed and letting the pattern face confront a high-dielectric substrate (a state of turning the film substrate of FIG. 1 of a prior art upside down), the face connection could be achieved. The bonding, however, raises the possibility of weakening a bonding force because of the fact that the imposing of a load and irradiating of ultrasonic waves are performed through the medium of the film substrate. Differing from this, the film substrate is eliminated in this embodiment. As a result, heating, imposing a load and irradiating ultrasonic waves may be directly applied to the connecting portion through the bonding from the side of the exposed connecting portion 16. This leads to both of the pattern faces being easily connected together while having a reduced impedance irregularity, a connecting state becomes stronger, and reliability of connection becomes high.

In addition, there is an advantage of a low part count because a gold ribbon is not required in this embodiment.

What is claimed is:

1. A method for producing a film-type transmission line comprising the steps of:
    forming a transmission line pattern on a single side of a film substrate; and
    removing a border area of the substrate adjacent an end portion of the transmission line pattern to leave a first connecting portion of the transmission line pattern exposed and protruding from a remaining portion of the substrate and a second portion of the transmission line pattern remaining thereon, the connecting portion being suitable for connecting the film-type transmission line to another transmission line.

2. A method for connecting a first film-type transmission line, which has a transmission line pattern formed on a film substrate, to a second transmission line, comprising the steps of:
    providing the first film-type transmission line having a first transmission line pattern formed on a film substrate, the first transmission line pattern having a first connection portion exposed and protruding from the substrate and a second portion on the substrate;
    placing the first transmission line adjacent the second transmission line having a second transmission line pattern on a side to be connected, so that the connecting portion of the first transmission line overlaps the second transmission line pattern to provide an overlapped portion, wherein the second transmission line has the second transmission line pattern formed on a substrate, and the substrates of the first transmission line and the second transmission line do not overlap; and
    applying bonding to the overlapped portion from a side of said exposed connecting portion.

3. A method according to claim 2, wherein the second transmission line has a transmission line pattern of gold or aluminum formed on a high dielectric substrate, and the method further comprises the steps of;
    adhering gold or aluminum on said exposed connecting portion of the first film-type transmission line, and
    overlapping said exposed connecting portion having gold or aluminum adhered thereto and the second transmission line pattern of the second transmission line to form an overlapped portion and thermocompression bonding or ultrasonic bonding the overlapped portion.

4. A method according to claim 1, wherein laser etching is used to remove the border area of said film substrate.

5. A method according to claim 2, wherein the second transmission line is a high-dielectric substrate type transmission line.

6. A method according to claim 3, wherein gold plating is applied to said exposed connecting portion.

7. A method according to claim 3, wherein aluminum evaporation processing is applied to said exposed connecting-portion.

8. A method according to claim 3, wherein gold plating or tinning processing is applied to said exposed connecting porton and further a gold stud bump is formed on the transmission line pattern on the side to be connected.

9. A method for producing a high-frequency circuit which includes a first film-type transmission line connected to a second transmission line, comprising the steps of;
    producing the first film-type transmission line by forming a first transmission line pattern on a film substrate;
    removing a border area of the film substrate adjacent an end of the first transmission line pattern to leave a first connecting portion of the transmission line pattern exposed and protruding from a second portion of the transmission line pattern remaining on the substrate, the connecting portion being suitable for connecting the first film-type transmission line to the second transmission line;
    placing the first transmission line adjacent the second transmission line having a second transmission line pattern on a side to be connected so that the connecting portion of the first transmission line overlaps the second transmission line pattern on the second transmission line to provide an overlapped portion, wherein the second transmission line has the second transmission line pattern formed on a substrate, and the substrates of the first transmission line and the second transmission line do not overlap; and
    applying bonding to the overlapped portion from a side of said exposed connecting portion.

10. A method according to claim 9, wherein laser etching is used to remove the border area of said film substrate.

11. The method of claimed 2, wherein the first transmission line pattern is formed on a single side of the film substrate.

12. The method of claim 9, wherein the first transmission line pattern is formed on a single side of the film substrate.

* * * * *

UNITED STATES PATENT AND TRADEMARK OFFICE
CERTIFICATE OF CORRECTION

PATENT NO. : 6,241,143 B1
DATED : June 5, 2001
INVENTOR(S) : Kazushi Kuroda

It is certified that error appears in the above-identified patent and that said Letters Patent is hereby corrected as shown below:

<u>Title page,</u>
Item [57] ABSTRACT, "thermo compression" should read -- thermocompresson --.

<u>Column 6, claim 7,</u>
Line 27, "connecting-portion" should read -- connecting portion --.

Signed and Sealed this

Twenty-ninth Day of January, 2002

Attest:

Attesting Officer

JAMES E. ROGAN
*Director of the United States Patent and Trademark Office*